(12) United States Patent
Fuller et al.

(10) Patent No.: US 12,200,869 B2
(45) Date of Patent: Jan. 14, 2025

(54) AUTODYNAMIC FLEXIBLE CIRCUITS

(71) Applicant: The Aerospace Corporation, El Segundo, CA (US)

(72) Inventors: Jerome K. Fuller, Van Nuys, CA (US); Todd Fillmore Sheerin, Beverly Hills, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 121 days.

(21) Appl. No.: 18/052,165

(22) Filed: Nov. 2, 2022

(65) Prior Publication Data

US 2024/0147626 A1     May 2, 2024

(51) Int. Cl.
| | |
|---|---|
| H05K 1/02 | (2006.01) |
| B64G 1/16 | (2006.01) |
| B64G 1/22 | (2006.01) |
| B64G 1/24 | (2006.01) |
| B64G 1/26 | (2006.01) |
| B64G 4/00 | (2006.01) |
| H05K 1/11 | (2006.01) |
| H05K 1/18 | (2006.01) |
| H05K 3/36 | (2006.01) |
| H05K 3/46 | (2006.01) |

(52) U.S. Cl.
CPC ............. H05K 1/189 (2013.01); H05K 1/118 (2013.01); H05K 3/363 (2013.01)

(58) Field of Classification Search
CPC ........ H05K 1/02; H05K 1/0212; H05K 1/028; H05K 1/118; H05K 1/167; H05K 1/189; H05K 3/46; H05K 3/363; H05K 2201/09063; B64G 1/16; B64G 1/22; B64G 1/24; B64G 1/66; B64G 1/264; B64G 1/413; B64G 1/446; B64G 1/1078; B64G 1/1081; B64G 1/2225; B64G 4/00; G06K 19/0723; G06K 19/0775; G06K 19/07718; G06K 19/07743; G06K 19/07747; G06K 19/07749; G06K 19/07754; G06K 19/07769; G06K 19/07783; G06K 19/07784; G06K 19/07788; G06K 19/07794

USPC ......... 361/748, 749; 174/261; 343/870, 895; 29/601, 829

See application file for complete search history.

(56) References Cited

U.S. PATENT DOCUMENTS

| | | | |
|---|---|---|---|
| 2015/0158307 A1* | 6/2015 | Lechleiter ........ | G06K 19/07743 358/1.15 |
| 2021/0249727 A1* | 8/2021 | Tomita ................ | H01M 50/519 |

OTHER PUBLICATIONS

Janson, Siegfried W., "Brane Craft", Final Report Submitted to NASA Feb. 1, 2017.

* cited by examiner

Primary Examiner — Xiaoliang Chen
(74) Attorney, Agent, or Firm — LeonardPatel PC

(57) ABSTRACT

A dynamic flex circuit includes a plurality of hole sets arranged along the dynamic flexible circuit. The dynamic flex circuit also includes a plurality of actuator wires coupled to the dynamic flexible circuit by way of intertwining each of the plurality of actuator wires through each hole set in the plurality of hole sets arrange along the dynamic flexible circuit. Each of the plurality of actuator wires are configured to impart a motion onto the dynamic flexible circuit depending on the amount of heat applied to each of the plurality of actuator wires.

8 Claims, 15 Drawing Sheets

DFC Parabolic Trough Reflector Switching from RF Antenna to Solar Collector

AUTODYNAMIC FLEXIBLE CIRCUITS

FIELD

The present invention relates to circuits, and more particularly, to circuits using shape memory alloys (SMAs).

BACKGROUND

Flexible circuits are well known and inhabit everything from cameras to CubeSats. Shape memory alloys are also well known. These are used to actuate mechanisms for spacecraft deployable arrays and to detach components for laptop computers. However, flexible circuits cannot and do not have the ability to change shape without external forces being applied.

Accordingly, an improved flexible circuit, which changes shape without external forces being applied, may be beneficial.

SUMMARY

Certain embodiments of the present invention may provide solutions to the problems and needs in the art that have not yet been fully identified, appreciated, or solved by current circuit technologies. For example, some embodiments of the present invention pertain to flexible circuits using SMAs.

In an embodiment, dynamic flex circuit includes a plurality of hole sets arranged along the dynamic flexible circuit. The dynamic flex circuit also includes a plurality of actuator wires coupled to the dynamic flexible circuit by way of intertwining each of the plurality of actuator wires through each hole set in the plurality of hole sets arrange along the dynamic flexible circuit. Each of the plurality of actuator wires are configured to impart a motion onto the dynamic flexible circuit depending on the amount of heat applied to each of the plurality of actuator wires.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments pertain to a dynamic flexible circuit that combines flexible circuit and shape memory alloys (SMAs). Flexible (or flex) circuits are flexible circuit boards made of polyimide plastic with copper circuit traces on or embedded therein. SMAs can be made of an alloy of nickel and titanium, and can be made to change shape when exposed to heat. For example, a nitinol SMA can be in the form of a simple wire that contracts when heated. This is sometimes called an actuator wire.

Unlike common flex circuits, which are static or movable only through an externally-applied impetus, the dynamic flex circuit may change shape by way of heating or cooling. To accomplish this, a closely-coupled nitinol "actuator wire" or set of wires is installed to a flex circuit to impart motion to the flex circuit. All the possibilities of traditional flex circuits are retained, but are now somewhat dynamic or movable, changing position or attitude, or proximity to a target.

The flex circuit may be used to aim a camera or grasp an object. Endowed with this technology, a circuit can orient a sensor or camera to track a target or turn a solar array to track the sun. In an embodiment, heat is applied to an object from a printed resistive heater or grasp with an electrostatic gripper. Using heating and cooling, the flex circuit may act as a thrust vector control steering element to steer embedded thruster nozzles.

With respect to a gripper, a robotic "arm" may include several rigid elements or booms and several motorized joints. The end of the arm usually has a more specialized part that is intended to interact with some part of the robot's environment, for example, a product to be packaged. The "end effector" is designed or selected to pick up and place that product without dropping it or damaging it. The end effector can be hand-like or jaw-like or apply a suction, etc. In the case of DFCs, this can be a separate attachment or can be incorporated into the same flex circuit as the rest of the robot or robot arm. This is shown on the bottom and bottom right of FIG. 8, for example.

Figure 1:
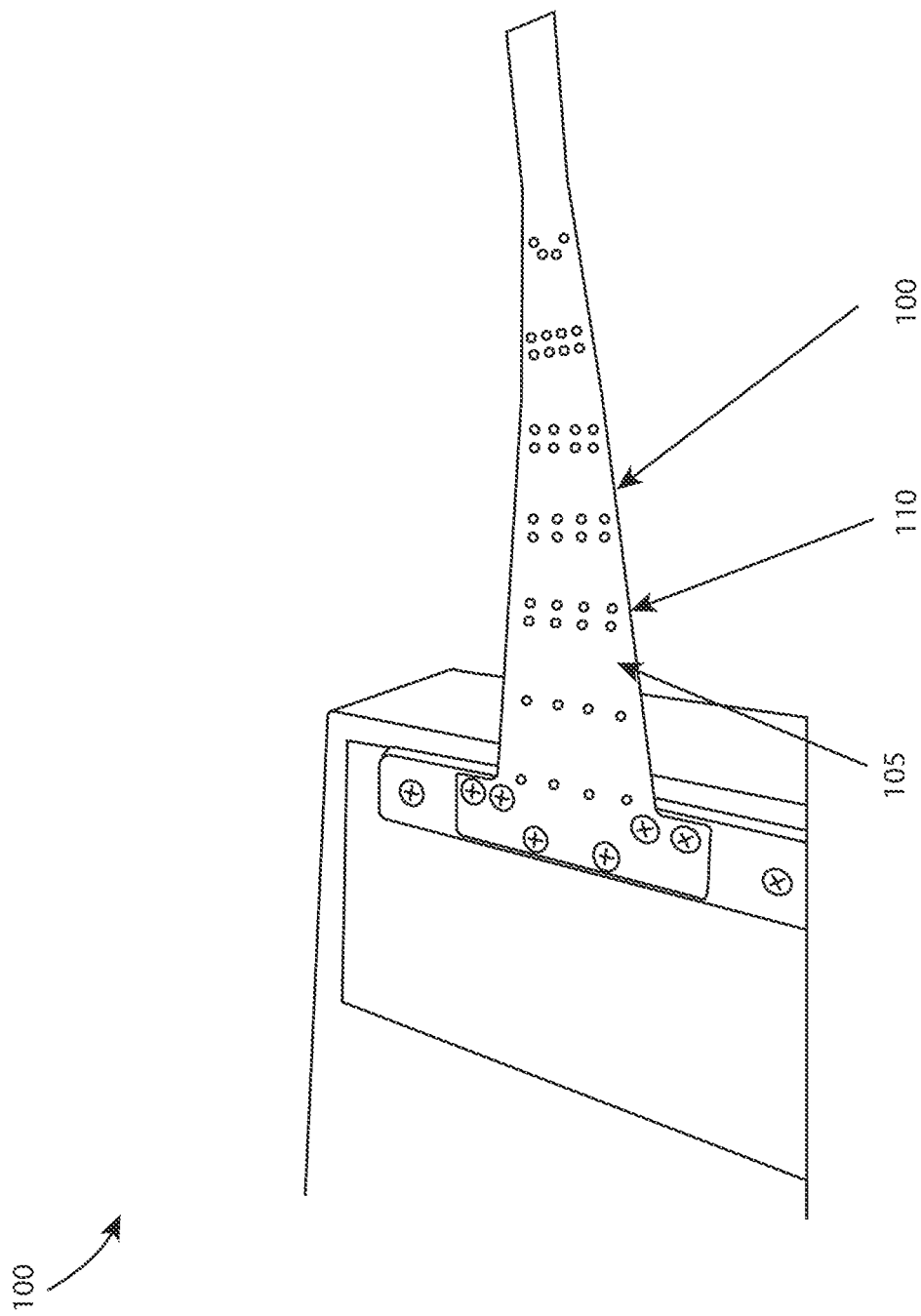
FIG. 1 is a diagram illustrating a flex circuit, according to an embodiment of the present invention.

FIG. 1 is a diagram illustrating a flex circuit 100, according to an embodiment of the present invention. In some embodiments, an actuator wire (e.g., nitinol actuator wire) 105 or a set of wires are coupled to a flex circuit 100 to impart motion to flex circuit 100. In one example, actuator wire 105 is attached to flex circuit 100 by intertwining through a hole set 110. Hole set 110 may include a first hole (closer hole) and a second hole (far hole). Continuing with this example and as shown in FIG. 1, there are multiple hole sets 110 arranged on flex circuit 100 in a row and column format. With this arrangement, actuator wire 105 goes out to the second hole (far hole) in hole set 110 and loops around and comes out from the first hole (closer hole) in hole set 110. From there, actuator wire 105 goes on to the next hole set. In other words, actuator wire 105 and hole sets 110 run in parallel with the length of flex circuit 100.

In some embodiments, a nitinol SMA wire can be in two shapes: a "trained" shorter shape and an extended shape. The wire is installed in its extended shape, such that the wire may shorten to the trained shape when heated by resistive heating through the application of an electric current.

To attach the wire, some methods may include the following: gluing, staking, soldering to solder pads, etc. It should be appreciated that staking is used in consumer electronics to secure elements such as circuit boards. In this embodiment, an element such as a circuit board is placed on a post in an injection molded part. A hot tool presses down on the top of that post, mushing it over to trap the circuit board. These methods may eliminate the need for holes and be more appropriate for mass production and easier assembly. What has been demonstrated is that the wire is looped (as described) through the far hole, and back through the near hole. Once the wire is looped through, a tensile force is applied to deform and "set" the shape of the wire at the location of a hole pair. See, for example, FIG. 2, which is a diagram illustrating a SMA 205 attached to flex circuit 200, according to an embodiment of the present invention. As shown in (a), SMA 205 is looped through holes 210 on flex circuit 200. In another embodiment, and as shown in (b), SMA 205 may be attached to flex circuit 200 via an adhesive or plastic staking. In another embodiment, and as shown in (c), SMA 205 may be attached to flex circuit 200 via soldering, i.e., soldering SMA 205 to a trace or solder pad embedded on flex circuit 200. As shown in (d), if trapping is used, an adhesive is used to attached the SMA to the flex circuit.

Trapping or keying elements are made from cuts in the circuit substrate, past which the SMA wire can be pushed. Cutting an "N" shape, for example, may produce two triangular features in the substrate. See FIG. 2, item (e). Lifting the tips of these triangles, and allowing a wire to pass under them, then releasing them can trap the wire. Applying an adhesive to the "N" afterward can reinforce this trapping.

Figure 2:
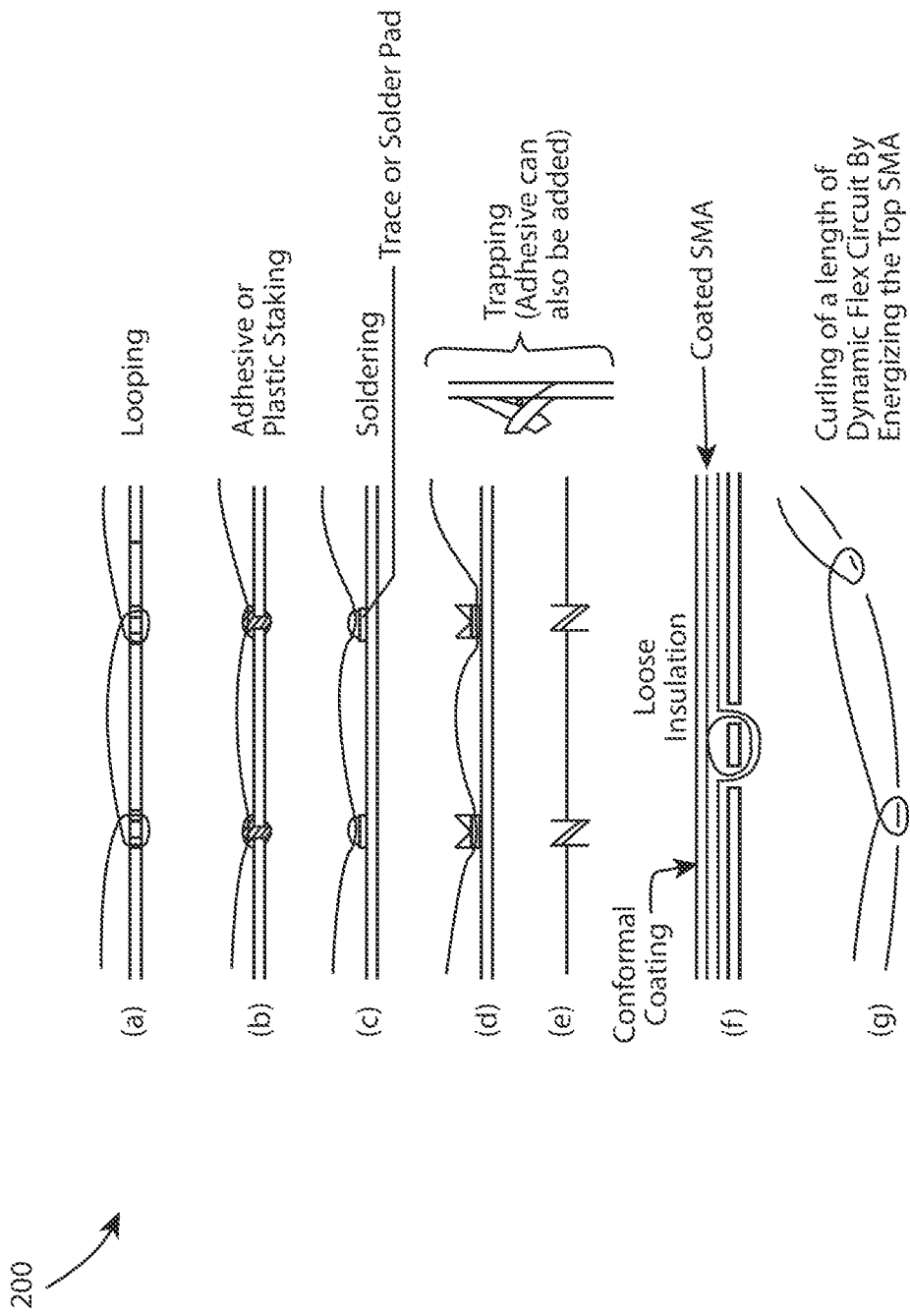
FIG. 2 is a diagram illustrating a SMA attached to flex circuit, according to an embodiment of the present invention.

As shown in (f), FIG. 2 shows a SMA actuator wire being insulated by conformal coating of the circuit. This may be accomplished by arranging sections of loose tubing around the wire or by insulating the wire before assembling using a coating. As shown in (g), the result of energizing a wire, where most of the wire is on the top surface of the circuit, is shown.

Returning to FIG. 1, with these embodiments, flex circuit 100 retains possibilities of traditional flex circuits, all while being dynamic and movable, changing position or attitude, or proximity to a target. For example, flex circuit 100 can aim a camera or grasp an object, to name a few. Endowed with this technology, flex circuit 100 may orient a sensor or camera to track a target or turn a solar array to track the sun.

The flex circuit 100 can apply heat to an object to form a printed resistive heater or grasp with an electrostatic gripper. In some embodiments, a flex circuit incorporates what is commonly called a "Kapton heater". In those embodiments, an undulating trace of a resistive conductor is applied in trace form over a portion of a polyimide film. Current through the trace causes resistive ($I^2R$) heating. If such a heater has an amount of hot-melt adhesive (hot glue) dispensed onto it, the adhesive is liquified by passing a current through the heater. Once liquified, the appendage is moved (i.e., by powering the SMAs) and held in position against another object (e.g., a piece of space debris, or a satellite to be relocated) until the HMA cools and solidifies. In some embodiments, a thermal sensor may provide feedback. A MEMS accelerometer may also be used to determine when contact with the target has been made. Once the target has been repositioned or reoriented, heat is applied again to remove and release the appendage from the target. Other methods of sensing proximity to the target include electrooptic, capacitive, and thermal sensors. Electrostatic grippers may use the electrostatic force from a voltage source. Here an object with smooth surfaces, like the solar arrays or body panels of a satellite can be attached to as if by "static cling".

In certain embodiments, flex circuit 100 acts as a thrust vector control steering element to steer embedded thruster nozzles. For example, low power thrusters, such as ion thrusters, are angled and aimed by placing the low power thruster on the end of a "dynamic flex circuit" (DFC). This may be used to accommodate debris removal or satellite repositioning where the exact center of mass of the combined target satellite and DFC satellite might not be known in advance. Alternately, placing an articulated deflecting element in the path of the thruster emissions may accomplish the same task.

In some embodiments, positive results are achieved using 0.005 inch Kapton polyimide film and 0.005 inch Flexinol nitinol actuator wire, with hole pairs spaced approximately half an inch apart. The nitinol in those embodiments were looped through the hole pairs from left to right, and returning to the left. Two lengths of wire were installed. One length was predominately exposed on the top side of the film and the other was predominately exposed on the bottom side.

In certain embodiments, the DFC is a SMA actuator material electrically coupled to one or more external circuits by pressure applied between the SMA actuator material and an exposed pad on a flexible or rigid portion and connected externally via one or more internal traces of the flexible circuit to one or more separately exposed pads. In further embodiments, an external connection is made between the SMA actuator material and the one or more external circuits via soldering, welding, or spring pins.

Figure 3:
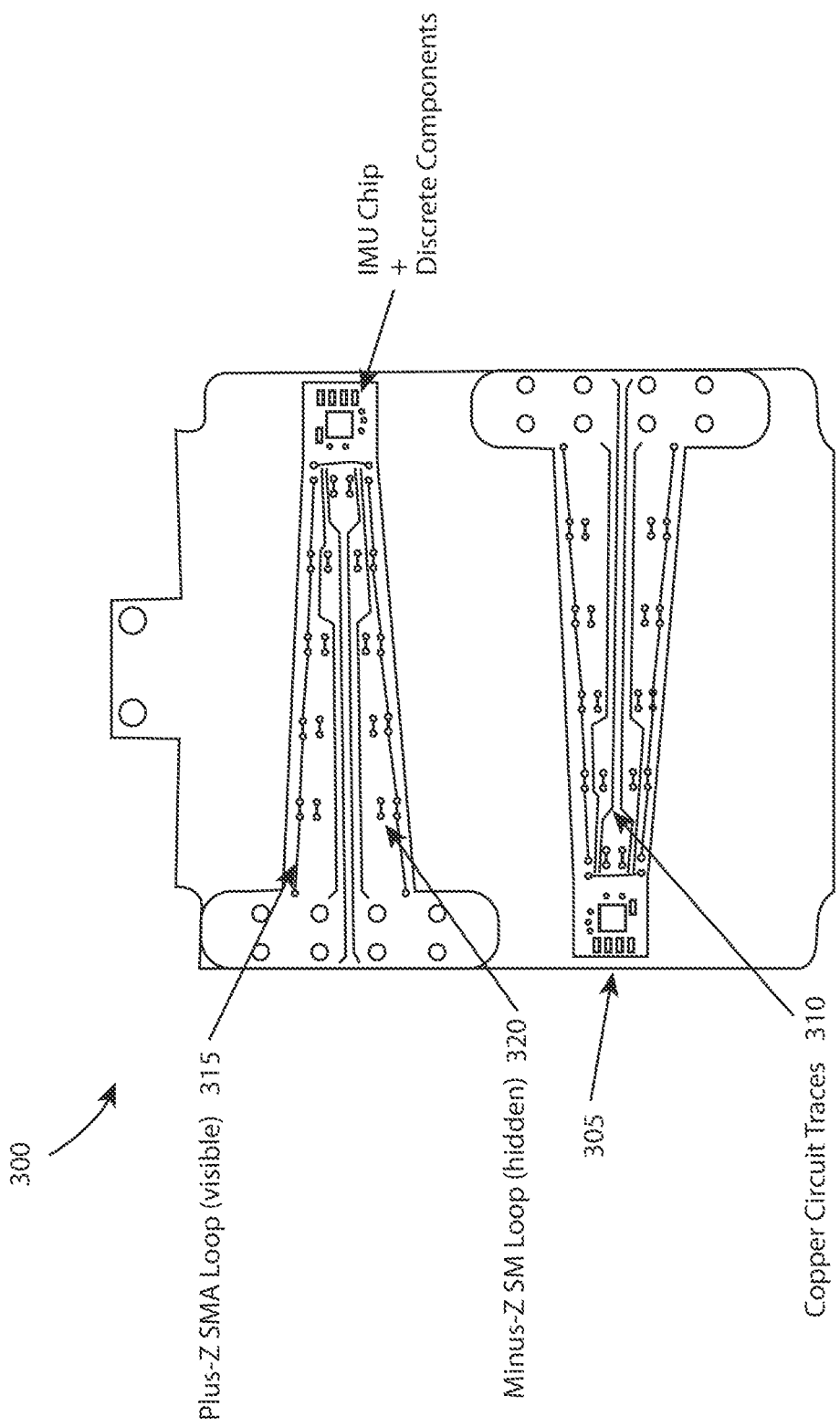
FIG. 3 is an exemplary diagram illustrating a payload of a CubeSat including a flex circuit, according to an embodiment of the present invention.

FIG. 3 is an exemplary diagram illustrating a payload of a CubeSat 300 including a flex circuit 305, according to an embodiment of the present invention. In some embodiments, flex circuit 305 may be composed of copper circuit traces 310, and include a plus-Z SMA loop (visible) 315 and a minus-Z SMA loop (hidden) 320.

For minus-Z SMA loop 320, let's imagine a flex circuit laying on top of a table. By looping the wire through a hole pair and onto the next hole pair, etc. so that the majority of the SMA wire is on the "top" of a flex circuit. This way, when the SMA wire is energized, the flex circuit may flex upward to form a concave shape. If the majority of the SMA wire is disposed below the circuit, the flex circuit may form a convex shape.

Figure 4:
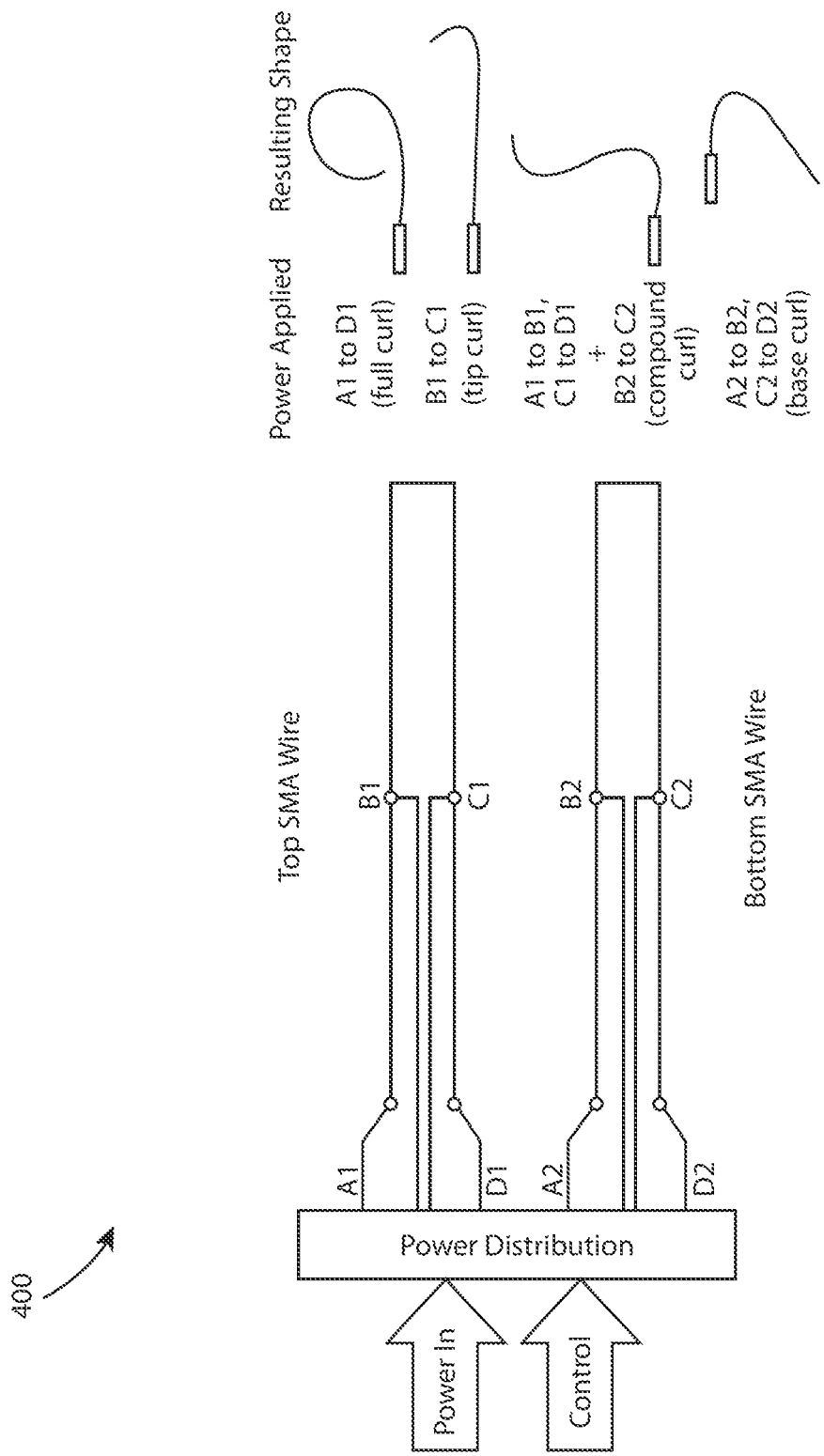
FIG. 4 is an electrical diagram illustrating a single DFC appendage, according to an embodiment of present invention.

In another embodiment, a DFC is used where the upward-bending and downward-bending wires are tapped near the center of the flex circuit. This is important for achieving more complex motions. If, for example, the tip is energized in a "downward" direction, but the base is energized in an upward direction, shapes and motions more appropriate for grasping and for locomotion than simple curling shapes can be realized with the DFC. In FIG. 4, an electrical schematic is shown. More specifically, FIG. 4 is an electrical diagram illustrating a single DFC appendage 400, according to an embodiment of present invention. In this embodiment, DFC appendage 400 has a first loop of SMA wire 405 to curl part or all of the flex circuit upward and second loop to curl it downward. Powering any combination of portions of these loops (using a center tap) can result in different shapes:

The payload described in some embodiments is a flight experiment where a miniature robotic arm or appendage is meant to make physical contact with a miniature satellite model under realistic lighting conditions (space). In one example, a SMA wire is looped through hole pairs from the base of a dynamic flex circuit appendage to the tip, and then back to the base. When energized, the appendage will move upward and contact the rectangular miniature satellite model. Once the appendage makes contact, that collision is detected using a MEMS accelerometer integrated circuit installed onto the flex circuit.

In some embodiments, a robotic appendage is made using a flex circuit that is endowed with the ability to change shape by applying an electric current. As seen in flex circuits, this "dynamic flex circuit" (DFC) incorporates electronic components, specifically, resistors and an integrated circuit sensor. A microelectromechanical systems (MEMS) integrated circuit (IC) configured to provide position feedback regarding the orientation and position of the tip of the DFC and to provide collision sensing.

Figure 5:
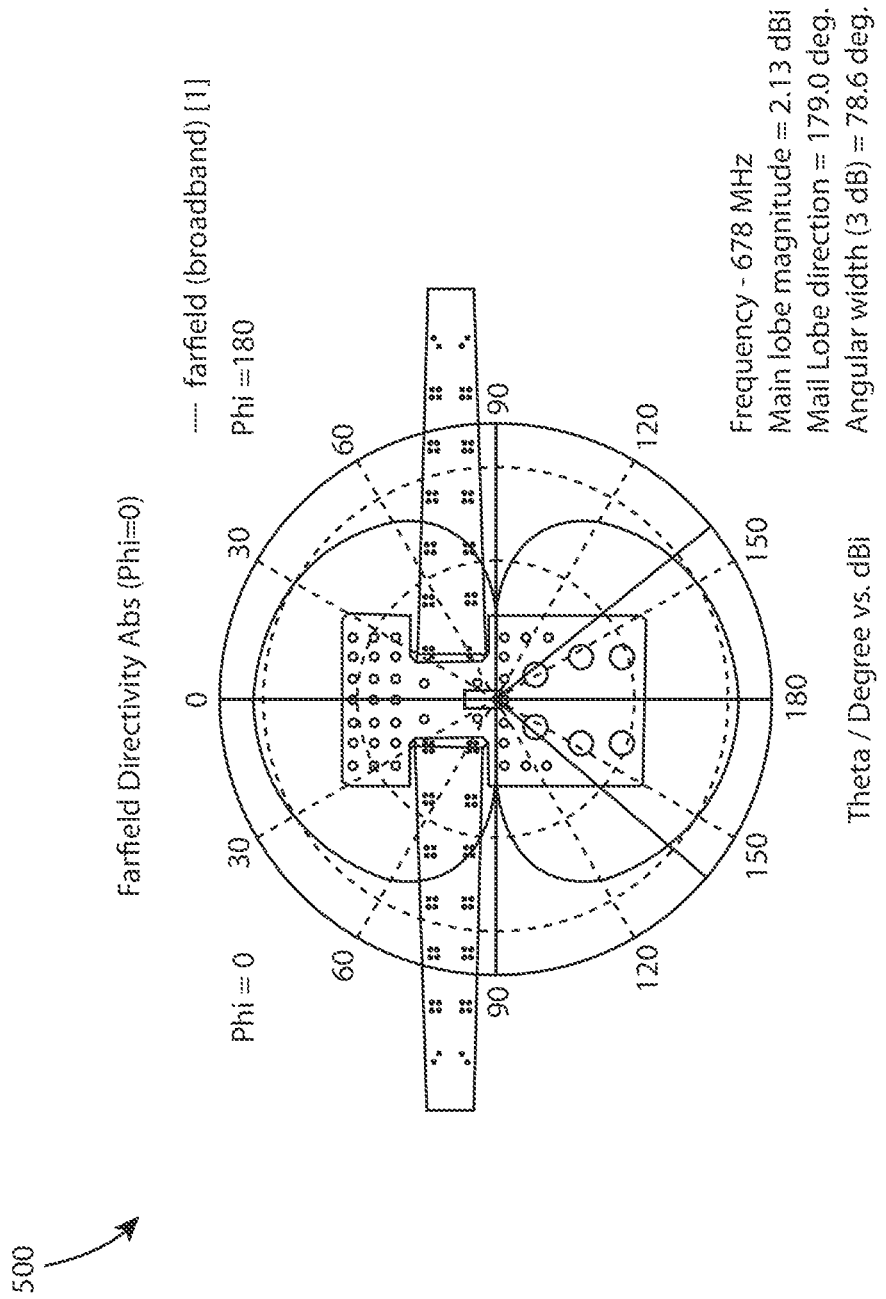
FIG. 5 is a diagram illustrating a dipole antenna configuration, according to an embodiment of the present invention.

FIG. 5 is a diagram 500 illustrating a dipole antenna configuration, according to an embodiment of the present invention. In a flat or linear configuration, such an antenna would produce the gain shown.

Figure 6:
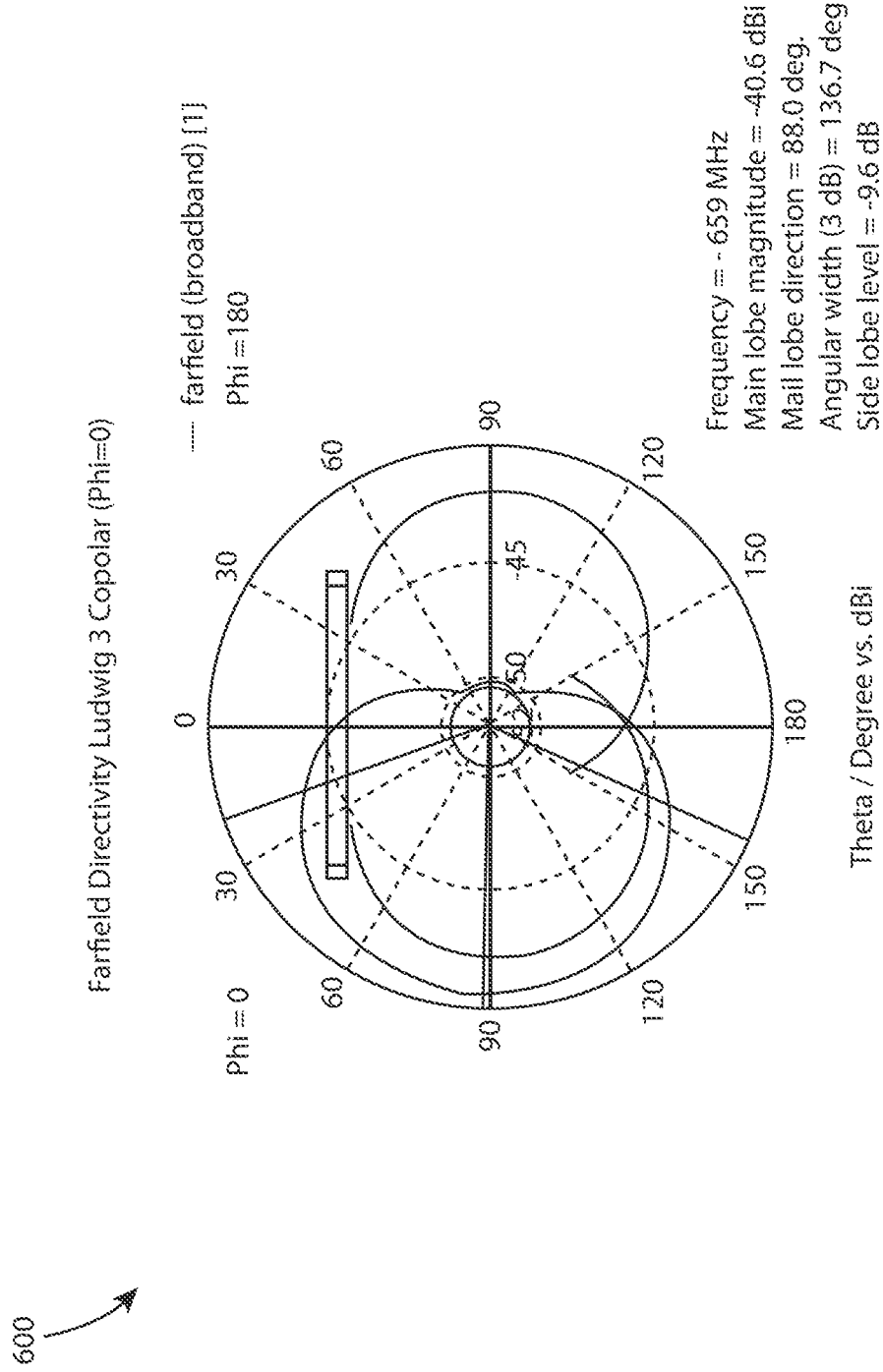
FIG. 6 is a diagram illustrating a dipole antenna configuration, according to an embodiment of the present invention.

FIG. 6 is a diagram 600 illustrating a dipole antenna configuration, according to an embodiment of the present invention. With the SMA actuator wire energized, curling the DFC into the position shown; the gain pattern or frequency sensitivity is modified from the original pattern shown in FIG. 5. Simply put, by changing the shape of a DFC-based antenna element, we can change the gain pattern or frequency sensitivity.

Figure 7:
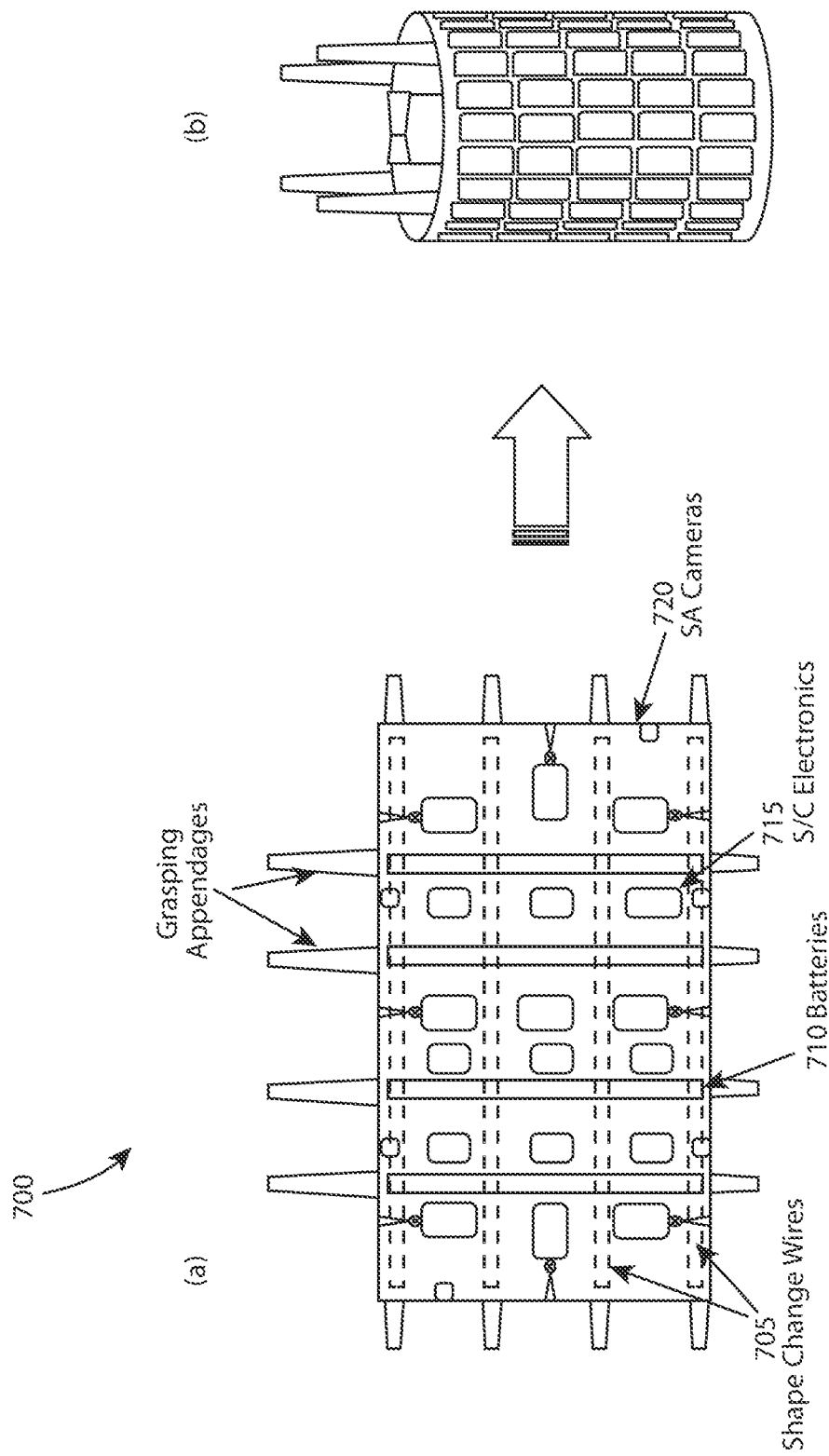
FIG. 7 is a diagram illustrating a shape changing spacecraft, according to an embodiment of the present invention.

FIG. 7 is a diagram illustrating a shape changing spacecraft 700, according to an embodiment of the present invention. In some embodiments, spacecraft 700 may be composed of a thin shaped body, similar to that of a flex circuit. This thin shaped body may be intertwined with a plurality of SMA wires 705 running along the length of spacecraft 700 body. Perpendicular to each SMA wire 705 are a plurality of batteries 710. Also included are spacecraft electronics 715 and cameras 720.

Batteries 710 in some embodiments are configured to activate a heating element (not shown). This heating element, when activated, may cause each SMA wire 705 to change the body of spacecraft 700 from a flat shape (a) to a curved shape (b). By changing the body of spacecraft 700 using SMA wires 705, spacecraft 700 may perform various movements such as thrusting, translation, pitch, yaw, and/or roll.

Figure 8:
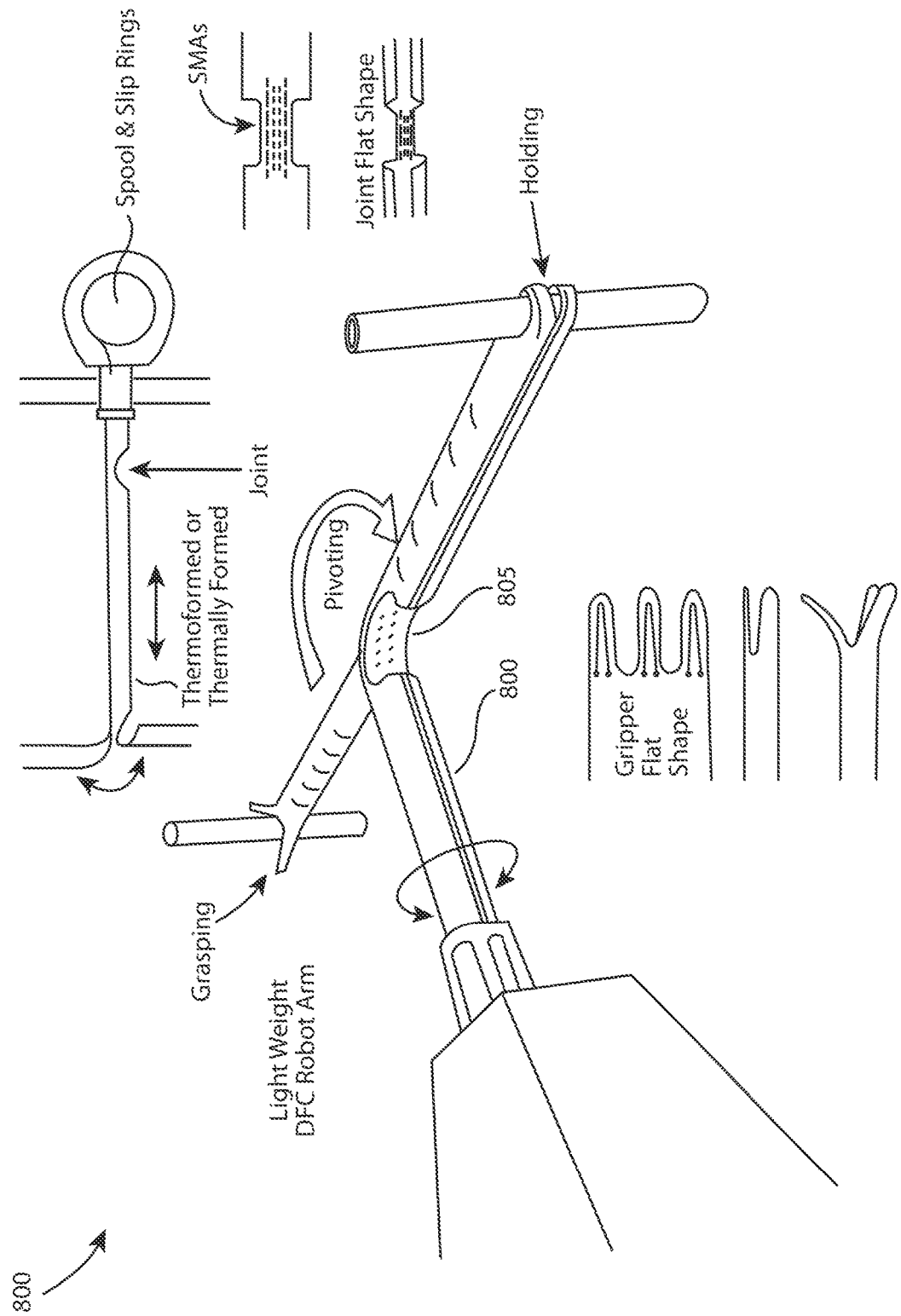
FIG. 8 is a diagram illustrating a boom composed of a flex circuit, according to an embodiment of the present invention.

FIG. 8 is a diagram illustrating a boom 800 composed of a flex circuit, according to an embodiment of the present invention. In some embodiments, boom 800 are stored on spools or paid-out as needed. Periodic sections of boom 800 may be laced with SMAs 805 to act as a joint, e.g., to perform pivoting. Spools in some embodiments are rotated (transverse to the spool axis) to rotate boom 800.

In this embodiment, a multi-element boom may be arranged as a single spool of material that, when paid-out, is articulated at one or more points and can incorporate feedback devices to establish the position, orientation, or configuration of the boom and proximity to or contact with a target.

Figure 9:
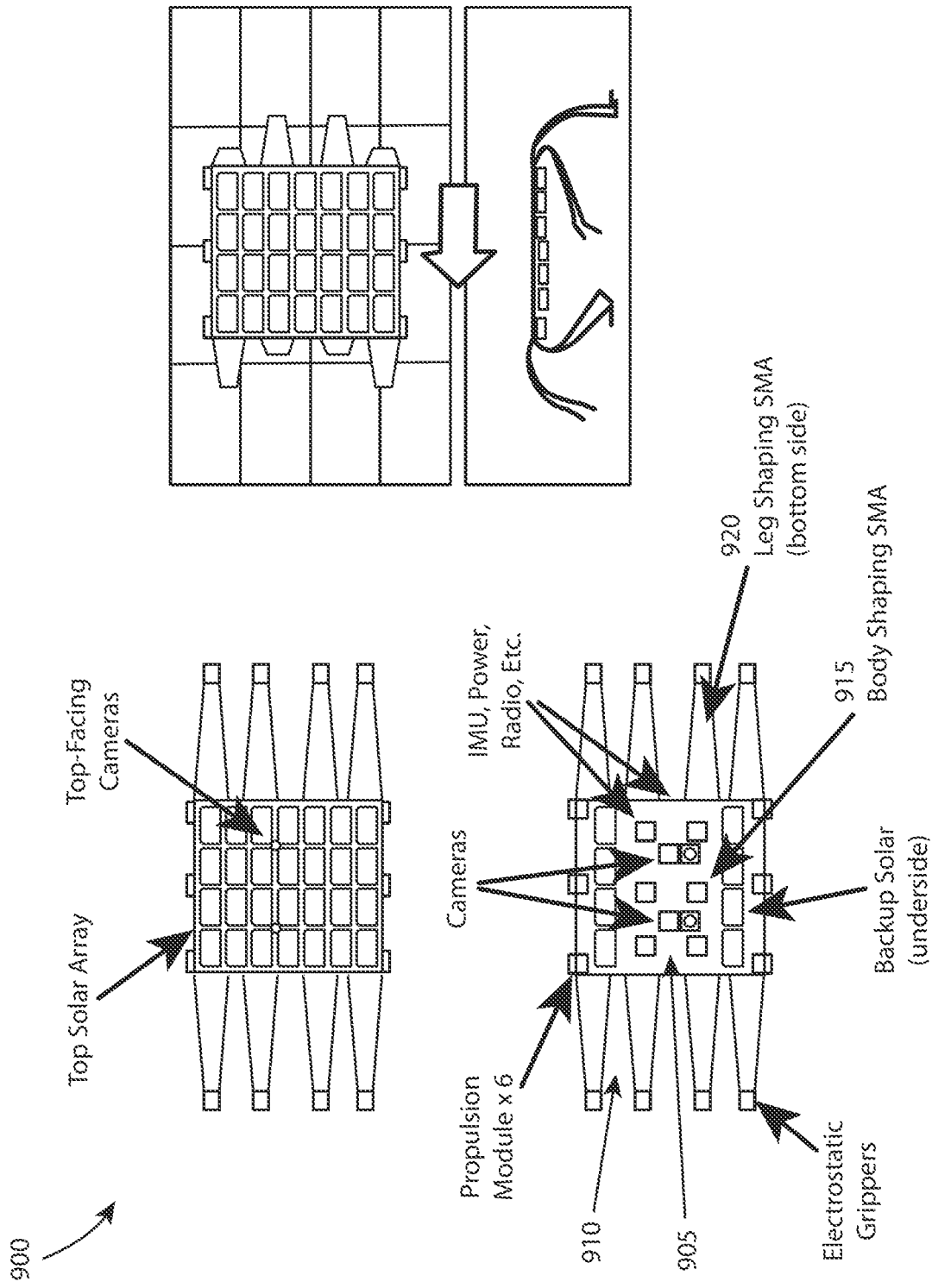
FIG. 9 is a diagram illustrating a walking rover for asteroid mining, according to an embodiment of the present invention.

FIG. 9 is a diagram illustrating a walking rover 900 for asteroid mining, according to an embodiment of the present invention. In some embodiments, walking rover 900 includes a body 905 and a plurality of legs 910. Both body 905 and legs 910 may be composed of a similar material as a flex circuit. Within both body 905 and legs 910 are body shape SMAs 915 and leg shaping SMAs 920, respectively.

Smaller astronomical bodies with weak gravity may be very difficult to explore with wheeled rovers such as those used on Mars. Further, fine particles pose a problem for reliability since they can find their way into bearings. Wheels, which require traction against a coalesced surface, may be much less effective when that surface is a loosely associated rock pile. In these embodiments, a DFC rover replaces wheels with legs. Without the mass of motors, gearboxes, and a stiff structure to support them, a legged rover can traverse an asteroid, or moon, or the surface of a spacecraft by a walking motion more like that of a biological organism such as an arthropod or a cephalopod. The body of such a walking rover might be covered with solar cells and may be articulated to allow a rearing motion. Since structural mass and the locomotion apparatus is low, propulsion requirements to land such a robot would be reduced.

With this configuration, no ball bearings are required. Wheeled rovers need several ball bearings, roller bearings, or plain bearings to accomplish locomotion or to position tools and cameras or other sensors. Further, astronomical bodies such as the Moon can be covered in highly abrasive regolith. In some embodiments, a rover furnished with flexible "legs" instead of wheels may be more successful in exploring these environments.

It should be noted that, in some embodiments, vacuum robotics applications that require lubricated bearings for processing semiconductor wafers may benefit from handling systems that are created as dynamic flex circuits instead of jointed robotic booms.

Figure 10:
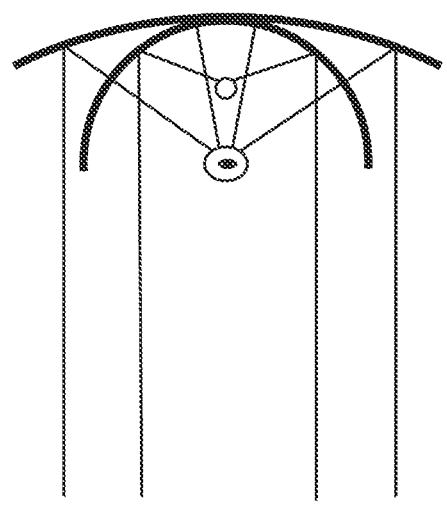
FIG. 10 is a diagram illustrating a deformable lightweight antenna or reflector, according to an embodiment of the present invention.

FIG. 10 is a diagram illustrating a deformable lightweight antenna or reflector 1000, according to an embodiment of the present invention. In some embodiments, an antenna 1000 includes a receiving element and a reflecting element (e.g., dish, trough) so that the shape of the reflector changes to produce a variable gain or pattern. Such an antenna 1000 might be a paraboloid cross-section shape for high gain reception or transmission with a narrow beam angle. In another embodiment, if antenna 1000 is flattened, a broader pattern with lower gain would be achieved. Energizing the SMA actuator wire of a DFC can allow a simple method of switching between a high-gain, narrow-beam shape and a low-gain, wide-beam shape.

Figure 11:
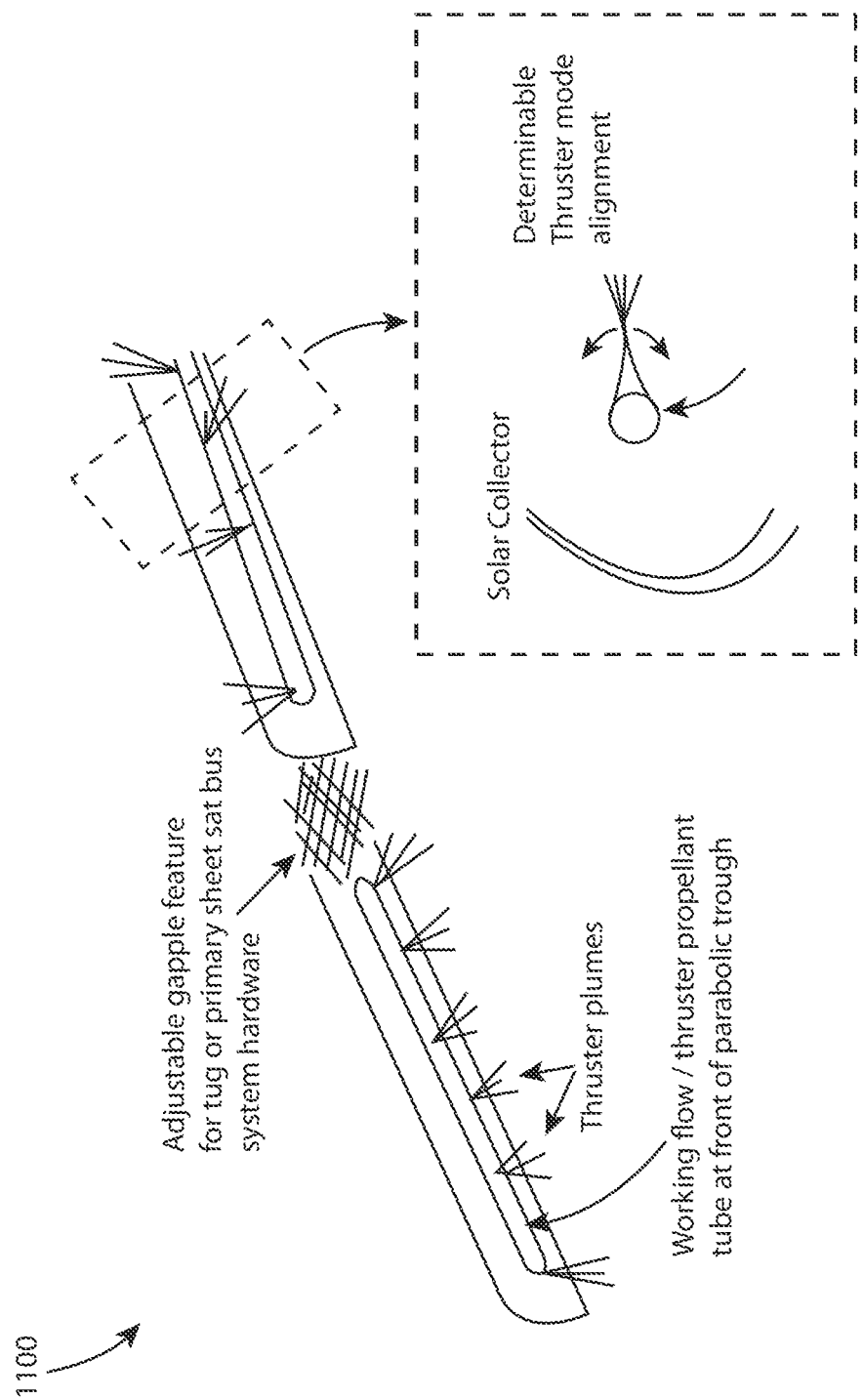
FIG. 11 is a diagram illustrating a solar thermal propulsion system, according to an embodiment of the present invention.

FIG. 11 is a diagram illustrating a solar thermal propulsion system 1100, according to an embodiment of the present invention.

In some embodiments, a spacecraft formed as a trough-shaped parabolic reflector can concentrate sunlight onto a tubular element at the focus of the parabola, heating parabola as needed to vaporize a solid or liquid propellant stored within the tubular element, or a liquid pumped into the tubular element. Such a spacecraft may have an array of solar cells on the opposing side or on both sides of the flex circuit. Changing the shape of the DFC may change the focus and the amount of light impinging on the tubular element.

Figure 12:
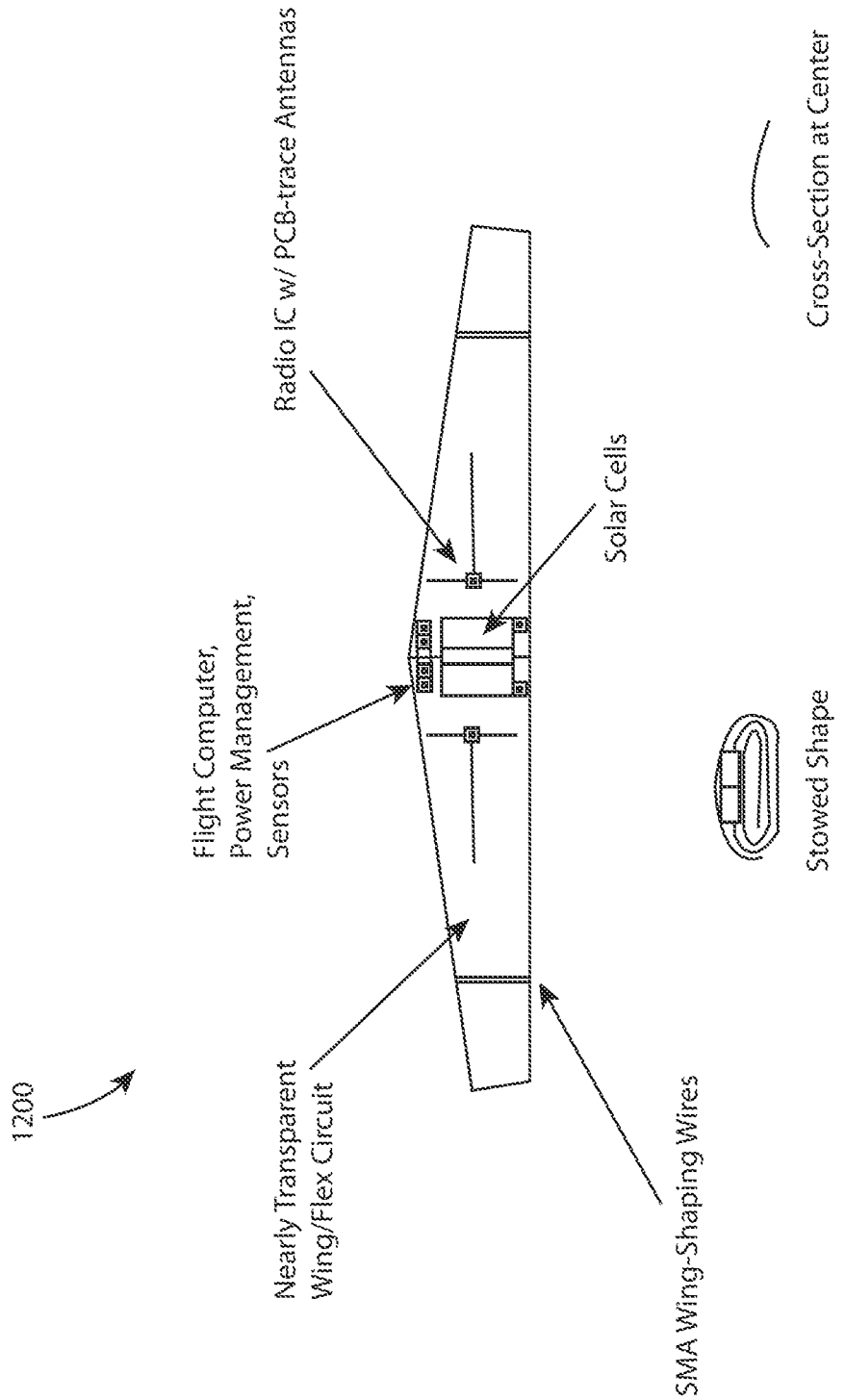
FIG. 12 is a diagram illustrating an unmanned aerial vehicle comprising SMA wing-shaping wires, according to an embodiment of the present invention.

FIG. 12 is a diagram illustrating an unmanned aerial vehicle 1200 comprising SMA wing-shaping wires, according to an embodiment of the present invention. In some embodiments, an unmanned aerial vehicle (UAV) or unmanned aerial system (UAS) can be stored in sheet or roll form and dispensed from a host aircraft or UAS. Such an aircraft might have propulsion or be a glider. In one embodiment, a single DFC board provides an aerodynamic "Flying Wing" shape and mounts solar cells, batteries and/or supercapacitors, a flight computer, a communications radio, a GPS radio receiver, sensors or cameras, a computer to monitor and store data from the sensors and cameras, and one or more SMA actuator wires disposed between structural elements of the wing to twist, warp, or change the camber of the wing. Once released from the host and unfurled, the SMA actuator wire(s) can be energized periodically to provide course corrections.

Figure 13:
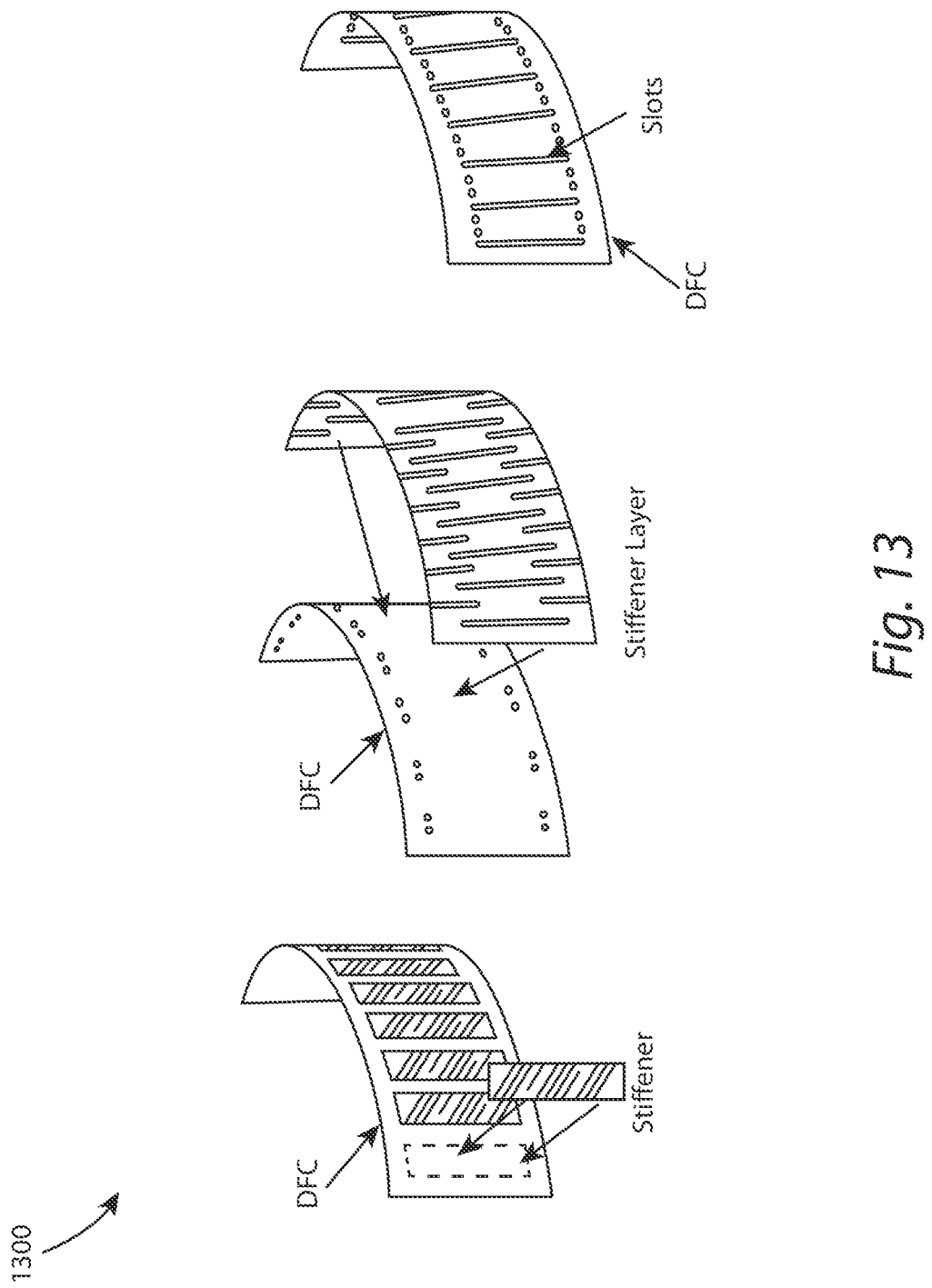
FIG. 13 is a diagram illustrating a rigid-flex circuit, according to an embodiment of the present invention.
Figure 14:
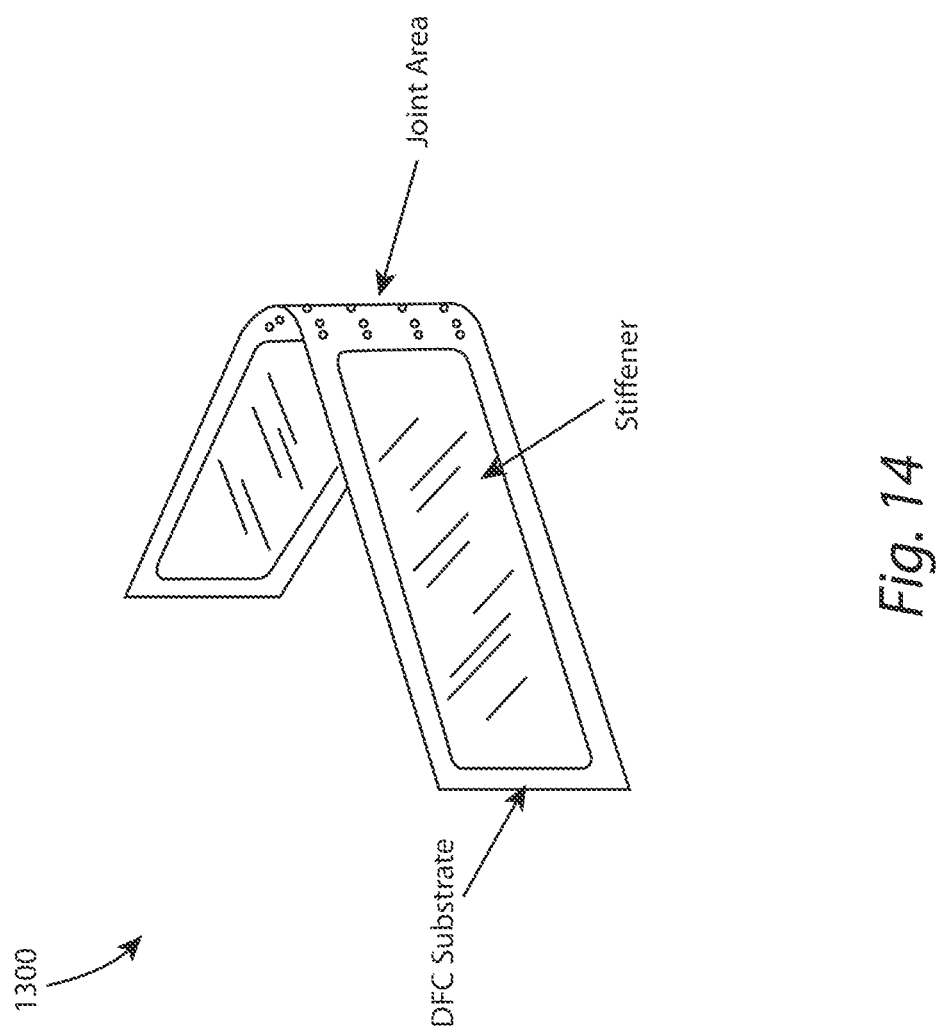
FIG. 14 is a diagram illustrating a rigid-flex circuit of FIG. 13, according to an embodiment of the present invention.

FIG. 13 is a diagram illustrating a rigid-flex circuit 1300, according to an embodiment of the present invention. In this embodiment, a rigid-flex circuit 1300 may have one or more thicker, stiffened sections 1305 applied to a flexible film. Thicker, stiffen sections 1305 includes reinforcing arrangement for bending or articulation in a predefined direction or along a predefined plane. FIG. 14 is a diagram illustrating a rigid-flex circuit 1300 of FIG. 13, according to an embodiment of the present invention. In this embodiment, the reinforcing arrangement 1405 creates more rigid sections joined by more limber sections, as in an "arm" or "finger" with flexible elements (joints) between rigid segments (bones).

Figure 15:
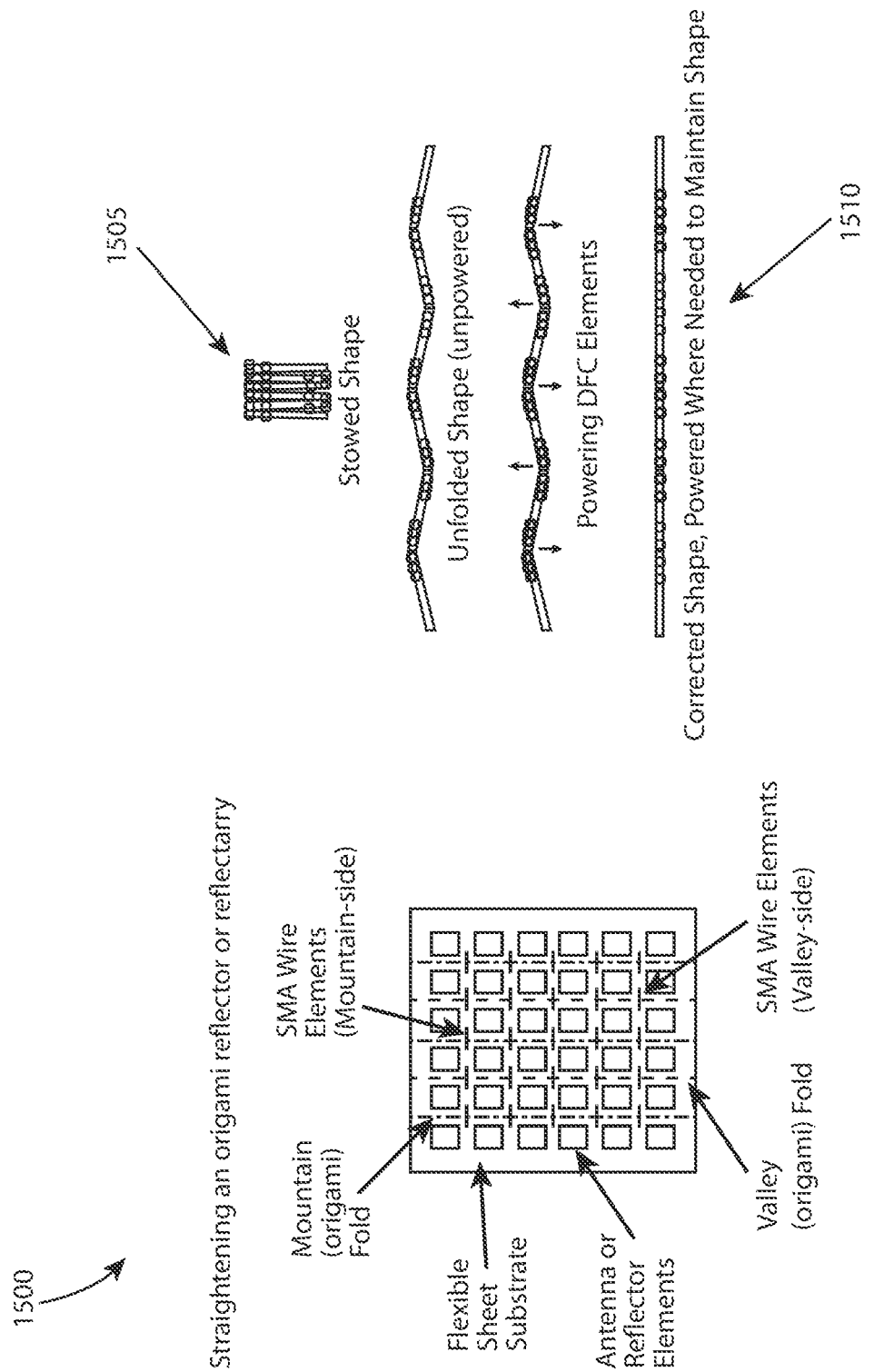
FIG. 15 is a diagram illustrating a folded sheet in a stowed (folded) and unfolded shape, according to an embodiment of the present invention.

FIG. 15 is a diagram illustrating a folded sheet in a stowed (folded) 1505 and unfolded shape 1510, according to an embodiment of the present invention. Many materials when folded and allowed to unfold will not unfold to a completely flat shape. Rather, they will retain some memory of their folded condition. An arrangement of SMA actuator wires in this embodiment corrects and finishes the unfolding until a specific shape is achieved. An origami-like pattern may be used to pack an antenna, antenna reflector or reflectarray into a small volume. If actuator wires are added above the "mountain folds" and the "valley folds" of such a structure, the final desired shape (flat in this embodiment) can be achieved. Feedback from sensors or cameras may also be used to monitor and actively correct the shape.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A dynamic flexible circuit, comprising:
   a plurality of hole sets arranged along the dynamic flexible circuit; and
   one or more of actuator wires coupled to the dynamic flexible circuit, each of the one or more wires are intertwined through each hole set in the plurality of hole sets arrange along the dynamic flexible circuit, wherein
   each of the one or more of actuator wires are configured to impart a motion onto the dynamic flexible circuit depending on an amount of heat applied to each of the one or more of actuator wires.

2. The dynamic flexible circuit of claim 1, wherein the one or more of actuator wires are made of alloy comprising nickel or titanium, all of which are configured to change in shape when exposed to heat.

3. The dynamic flexible circuit of claim 1, wherein the one or more of actuator wires are nitinol shape memory alloys configured to be in a first shape or a second shape.

4. The dynamic flexible circuit of claim 1, wherein the plurality of holes sets are arranged on the dynamic flexible circuit in a row and column format.

5. The dynamic flexible circuit of claim 1, wherein the one or more of wires are connected to the dynamic flexible circuit by way of looping, adhesive or plastic staking, soldering, trapping, coating and looping, or curling.

6. The dynamic flexible circuit of claim 1, wherein the one or more of actuator wires comprises two or more actuator wires, the two or more actuator wires comprises a first wire configured to be exposed mostly on top of the dynamic flexible circuit and a second wire configured to be exposed mostly below the dynamic flexible circuit.

7. The dynamic flexible circuit of claim 1, further comprising:
   memory comprising a set of instructions, wherein
   the set of instructions is configured to control a position, orientation, or configuration of the flexible circuit via a feedback loop sensed by a light emitting diode (LED) emitter and detector, a change in resistance, capacitance or inductance, a magnetic sensor, MEMS gyroscope, MEMS accelerometer, or MEMS magnetometer.

8. The dynamic flexible circuit of claim 1, wherein one of the one or more actuator wires is energized forcing an appendage or the dynamic flexible circuit to change from a first state to a second state, and
   another one of the one or more of actuator wires is configured to return the appendage or the dynamic flexible circuit from the second state to the first state, or
   straight elongated material affixed to the appendage or the dynamic flexible circuit, configured to return the appendage from the second state to the first state.

* * * * *